United States Patent
Simin et al.

(10) Patent No.: US 8,461,631 B2
(45) Date of Patent: *Jun. 11, 2013

(54) COMPOSITE CONTACT FOR SEMICONDUCTOR DEVICE

(75) Inventors: Grigory Simin, Columbia, SC (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 615 days.

This patent is subject to a terminal disclaimer.

(21) Appl. No.: 11/781,302

(22) Filed: Jul. 23, 2007

(65) Prior Publication Data

US 2008/0203446 A1    Aug. 28, 2008

Related U.S. Application Data

(60) Provisional application No. 60/903,104, filed on Feb. 23, 2007, provisional application No. 60/905,634, filed on Mar. 8, 2007, provisional application No. 60/903,109, filed on Feb. 23, 2007, provisional application No. 60/905,725, filed on Mar. 8, 2007.

(51) Int. Cl.
*H01L 21/336* (2006.01)
(52) U.S. Cl.
USPC ............. 257/280; 257/E33.066; 438/98
(58) Field of Classification Search
USPC ................. 257/280, E33.066; 438/98
See application file for complete search history.

(56) References Cited

U.S. PATENT DOCUMENTS

| | | | |
|---|---|---|---|
| 4,638,341 A | 1/1987 | Baier et al. | |
| 5,126,284 A | 6/1992 | Curran | |
| 5,196,907 A | 3/1993 | Birkle et al. | |
| 5,241,193 A * | 8/1993 | Pfiester et al. | 257/67 |
| 5,552,714 A | 9/1996 | Adamian et al. | |
| 6,207,584 B1 | 3/2001 | Shen et al. | |
| 6,285,042 B1 * | 9/2001 | Ohtani et al. | 257/66 |
| 6,538,538 B2 | 3/2003 | Hreish et al. | |
| 6,589,822 B1 | 7/2003 | Yamazaki et al. | |
| 6,690,042 B2 | 2/2004 | Khan et al. | |
| 6,690,176 B2 | 2/2004 | Toncich | |
| 6,759,839 B2 | 7/2004 | Kodato | |
| 6,812,714 B2 | 11/2004 | Verspecht et al. | |
| 6,878,593 B2 | 4/2005 | Khan et al. | |

(Continued)

FOREIGN PATENT DOCUMENTS

JP    2007048866    2/2007

OTHER PUBLICATIONS

U.S. Appl. No. 11/781,308; "Office Action" Apr. 6, 2009, 9 pages.

(Continued)

*Primary Examiner* — Thao Le
*Assistant Examiner* — Matthew Gordon
(74) *Attorney, Agent, or Firm* — LaBatt, LLC (57) ABSTRACT

A composite contact for a semiconductor device is provided. The composite contact includes a DC conducting electrode that is attached to a semiconductor layer in the device, and a capacitive electrode that is partially over the DC conducting electrode and extends beyond the DC conducting electrode. The composite contact provides a combined resistive-capacitive coupling to the semiconductor layer. As a result, a contact impedance is reduced when the corresponding semiconductor device is operated at high frequencies.

17 Claims, 9 Drawing Sheets

U.S. PATENT DOCUMENTS

| | | | |
|---|---|---|---|
| 6,903,385 | B2 | 6/2005 | Gaska et al. |
| 6,998,833 | B2 | 2/2006 | Wang et al. |
| 7,248,866 | B1 | 7/2007 | Tsironis |
| 7,282,911 | B2 | 10/2007 | Xiang et al. |
| 7,548,069 | B2 | 6/2009 | Simpson |
| 7,674,666 | B2 | 3/2010 | Simin et al. |
| 7,828,911 | B2 | 11/2010 | Gentschev et al. |
| 8,203,347 | B2 | 6/2012 | Nakayama et al. |
| 8,203,348 | B1 | 6/2012 | Tsironis |
| 2001/0009785 | A1 | 7/2001 | Arafa et al. |
| 2004/0036086 | A1 | 2/2004 | Khan et al. |
| 2004/0061129 | A1 | 4/2004 | Saxler et al. |
| 2005/0001234 | A1* | 1/2005 | Inoue et al. .................. 257/192 |
| 2005/0173728 | A1 | 8/2005 | Saxler |
| 2005/0274977 | A1 | 12/2005 | Saito et al. |
| 2006/0235638 | A1 | 10/2006 | Verspecht |
| 2006/0279275 | A1 | 12/2006 | Simpson |
| 2007/0278518 | A1* | 12/2007 | Chen et al. .................. 257/192 |
| 2007/0295993 | A1 | 12/2007 | Chen et al. |
| 2008/0272397 | A1 | 11/2008 | Koudymov et al. |
| 2009/0008804 | A1 | 1/2009 | Standing et al. |
| 2010/0026315 | A1 | 2/2010 | Simpson |
| 2010/0156475 | A1 | 6/2010 | Simin et al. |

OTHER PUBLICATIONS

U.S. Appl. No. 11/781,308; "Amendment to Office Action", Jul. 8, 2009, 14 pages.
U.S. Appl. No. 11/781,338, "Office Action", Mar. 6, 2009, 18 pages.
U.S. Appl. No. 11/781,338, "Amendment to Office Action", May 19, 2009, 12 pages.
U.S. Appl. No. 11/781,338, "Final Office Action", Jul. 10, 2009, 15 pages.
U.S. Appl. No. 11/781,338, "Amendment to Final Office Action", Sep. 1, 2009, 17 pages.
U.S. Appl. No. 11/781,308, "Notice of Allowance", Oct. 20, 2009, 13 pages.
Raj R. Gupta, "Notice of Allowance", U.S. Appl. No. 11/781,338, Date Mailed: Sep. 16, 2009, 10 pages.
Benitez, U.S. Appl. No. 12/646,121, Office Action Communication, Mar. 29, 2012, 23 pages.
Sungjae Lee et al., "Record RF performance of 45-nm SOI CMOS Technology", IEDM Technical Digest, pp. 255-258, Copyright 2007.
R. Lai et al., "Sub 50 nm InP HEMT Device with Fmax Greater than 1 THz", IEDM Technical Digest, pp. 609-611, IEEE, Copyright 2007.
Zukauskas et al., "Solid State Lighting", Copyright Wiley 2002, http://nina.ecse.rpi.edu/shur/, 132 pages.
Koudymov et al., "RF Transmission Line Method for Wide-Bandgap Heterostructures", IEEE Electron Device Letters, vol. 30, No. 5, pp. 433-435, May 2009.
Simin et al., "III-Nitride Transistors with Capacitively Coupled Contacts", Applied Physics Letters 89, 033510, pp. 1-3, 2006.
Simin et al., "RF-Enhanced Contacts to Wide-Bandgap Devices", IEEE Electron Device Letters, vol. 28, No. 1, pp. 2-4, Jan. 2007.
Stillman et al., "Closing the Gap: Plasma Wave Electronic Terahertz Detectors", Journal of Nanoelectronics and Optoelectronics, vol. 2, No. 3, pp. 209-221, Dec. 2007.
Foutz et al., "Transient Electron Transport in Wurtzite GaN, InN, and AlN", Journal of Applied Physics, vol. 85, No. 11, pp. 7727-7734, Jun. 1, 1999.
G. Simin, "Wide Bandgap Devices with Non-Ohmic Contacts", ECS 2006—210th Meeting of the Electrochemical Society, Cancun, Mexico, Oct. 29-Nov. 3, 2006, 7 pages.
Pala et al., "Drain-to-Gate Field Engineering for Improved Frequency Response of GaN-based HEMTs", IEEE, 2007, 2 pages.
Turin et al., "Simulations of Field-Plated and Recessed Gate Gallium Nitride-Based Heterojunction Field-Effect Transistors", International Journal of High Speed Electronics and Systems, vol. 17, No. 1, pp. 19-23, 2007.
Mayo Clinic, "HRL InP NMIC GHz", http://www.mayo.edu/sppdg/packaging_development.html, 2 pages.
Simin et al., "High-Power III-Nitride Integrated Microwave Switch with Capacitively-Coupled Contacts", IEEE 2007, pp. 457-460.
Hess and Brennan (1984), Handbook of Semiconductor Parameters, "7.3.2. Transport Properties in High Electric Field", vol. 1, p. 156.
Arora, Ajay, USPTO Office Action, U.S. Appl. No. 12/645,876, Notification Date Jan. 3, 2012, 16 pages.
Kim, International application No. PCT/US2012/025146, International Search Report and the Written Opinion of the International Searching Authority, Aug. 1, 2012, 9 pages.
Benitez, U.S. Appl. No. 12/646,121, Office Action Communication, Sep. 7, 2012, 17 pages.
Benitez, U.S. Appl. No. 12/646,121, Notice of Allowance, Nov. 19, 2012, 14 pages.
PCT International Search Report and Written Opinion; Jul. 30, 2008; 10 pages.
Arora, U.S. Appl. No. 12/645,876, Notice of Allowance & Fees Due, Aug. 21, 2012, 14 pages.

* cited by examiner

COMPOSITE CONTACT FOR SEMICONDUCTOR DEVICE

REFERENCE TO RELATED APPLICATIONS

The current application claims the benefit of U.S. Provisional Application No. 60/903,104, titled "Radio-frequency enhanced contacts to semiconductor devices", which was filed on 23 Feb. 2007 and U.S. Provisional Application No. 60/905,634, titled "Radio-frequency enhanced contacts to semiconductor devices", which was filed on 8 Mar. 2007, both of which are hereby incorporated by reference. Aspects of the application are also related to U.S. Provisional Application No. 60/903,109, titled "Method of fabrication of radio-frequency enhanced contacts", which was filed on 23 Feb. 2007, U.S. Provisional Application No. 60/905,725, titled "Method of fabrication of semiconductor devices with radio-frequency enhanced contacts", which was filed on 8 Mar. 2007, and co-pending U.S. Utility application Ser. No. 11/781,308, titled "Fabrication of semiconductor device having composite contact", which was filed on 23 Jul. 2007, all of which are hereby incorporated by reference.

FIELD OF THE DISCLOSURE

Aspects of the disclosure relate generally to contacts for semiconductor devices, and more particularly, to semiconductor devices/structures that include a composite contact.

BACKGROUND OF THE DISCLOSURE

Figure 1A:
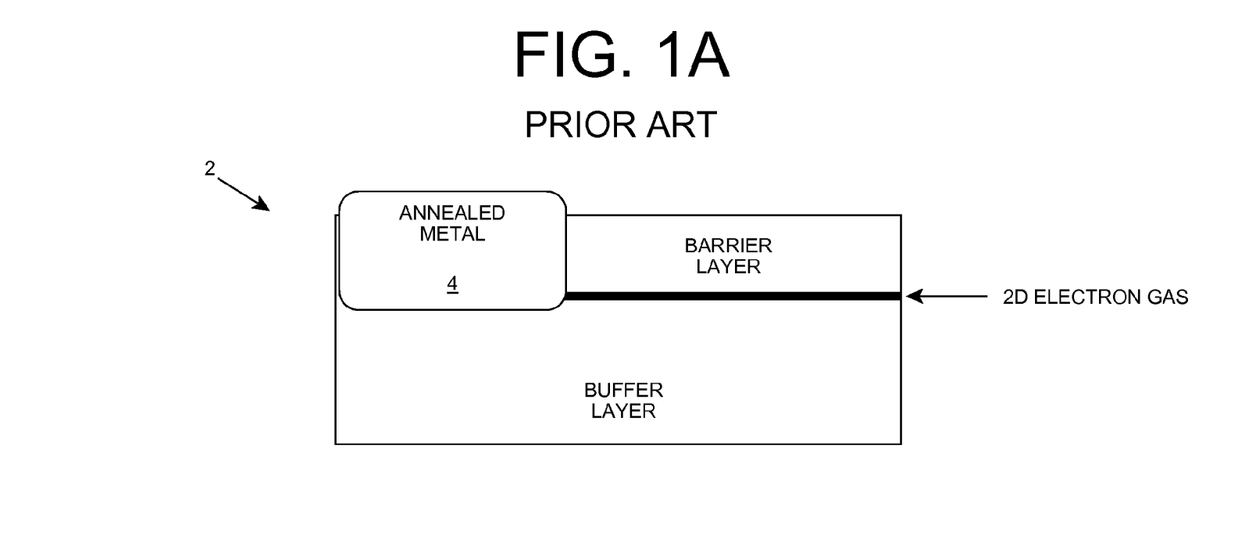
FIGS. 1A-B show a structure and equivalent circuit, respectively, of a typical annealed metal contact according to the prior art.
Figure 1B:
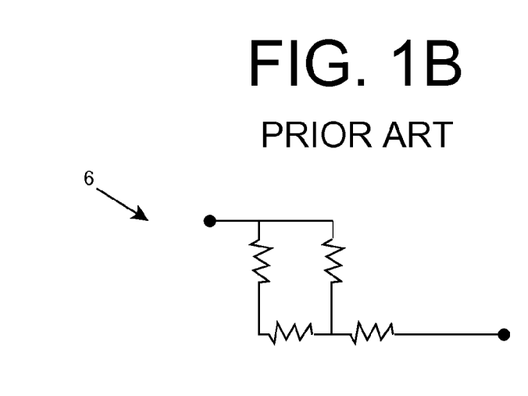

The formation of a contact for a semiconductor device is an important process in fabricating the semiconductor device. For example, contact resistance significantly affects the performance characteristics of the semiconductor device. As a result, achieving a low contact resistance is typically desired. FIGS. 1A-B show a structure 2 and equivalent circuit 6, respectively, of a typical annealed metal (e.g., Ohmic) contact 4 according to the prior art. In particular, contact 4 comprises a contact to a heterostructure with a two-dimensional (2D) electron gas at the heterointerface. In this case, the equivalent circuit 6 consists of resistive components. Therefore, the resistance of contact 4 is frequency independent.

However, in many high-frequency semiconductor devices, the resistance of contact 4 is a dominant factor in limiting the performance of the device. To date, a low contact resistance can be obtained by using high-temperature annealing in the contact formation. Such annealing remains a challenging technology, especially for wide bandgap semiconductor materials. In particular, as the material bandgap increases, the required contact annealing temperature increases, yet the contact resistance also increases. Additionally, contact formation becomes even more challenging with novel emerging wide bandgap material systems and devices, such as material systems/devices based on aluminum nitride (AlN), diamond, and others.

For example, Au/Ge/Ni/Au contacts to gallium arsenide (GaAs) or indium GaAs (InGaAs) require an annealing temperature in the range of 350-425 degrees Celsius and produce unit-width contact resistances as low as $0.1\Omega$-mm or even lower. For gallium nitride (GaN), contact formation using Ti/Al contacts requires an annealing temperature in the range of 800-850 degrees Celsius with typical unit-width contact resistances in the range of $0.5$-$1.0\Omega$-mm. While advanced annealing techniques have been shown to yield lower unit-width contact resistances, the general trend in which high annealing temperatures lead to significant morphology degradation, defect generation, and contact edge roughness remains.

Figure 2A:
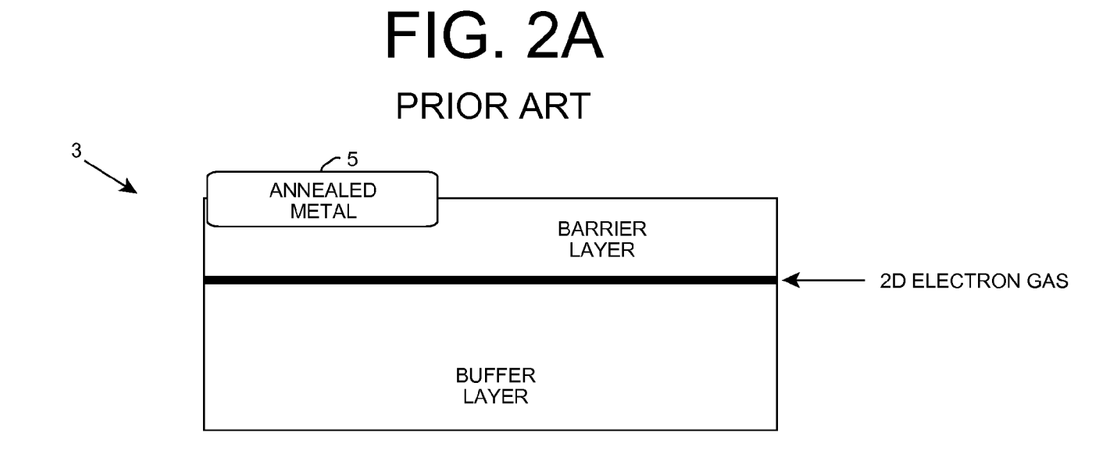
FIGS. 2A-B show another structure and equivalent circuit, respectively, of an alternative metal contact according to the prior art.
Figure 2B:
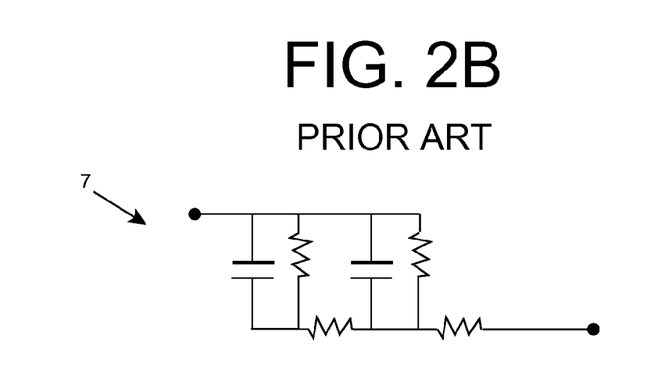

FIGS. 2A-B show another structure 3 and equivalent circuit 7, respectively, of an alternative metal contact 5 according to the prior art. In particular, metal contact 5 comprises a conventional, under annealed contact, in which there is a capacitive coupling between the metal and the underlying two-dimensional electron gas. In this case, the capacitive coupling has been shown to reduce the access resistance to the two-dimensional electron gas at high frequencies (e.g., radio frequencies).

However, access resistance between a device channel and a contact region, where electrons enter into a narrow channel from a thick contact region, remains a large contributor to the overall contact resistance. While under annealed contact 5 has a smaller impedance at higher frequencies, it does not reduce the access resistance between the device channel and contact region. Further, under annealed contact 5 does not provide any ability to achieve self-aligned or alignment-free fabrication.

SUMMARY OF THE INVENTION

Aspects of the invention provide a composite contact for a semiconductor device. The composite contact includes a direct current (DC) conducting electrode that is attached to a semiconductor layer in the device, and a capacitive electrode that is partially over the DC conducting electrode and extends beyond the DC conducting electrode. The composite contact provides a combined resistive-capacitive coupling to the semiconductor layer. As a result, a contact impedance is reduced when the corresponding semiconductor device is operated at high frequencies.

A first aspect of the invention provides a semiconductor structure comprising: a semiconductor layer; and a composite contact to the semiconductor layer, the composite contact including: a DC conducting electrode attached to the semiconductor layer; and a capacitive electrode, the capacitive electrode partially over the DC conducting electrode and extending beyond the DC conducting electrode.

A second aspect of the invention provides a semiconductor device comprising: a semiconductor layer; a device conducting channel; and a composite contact to the semiconductor layer, the composite contact including: a DC conducting electrode attached to the semiconductor layer; and a capacitive electrode, the capacitive electrode partially over the DC conducting electrode and extending beyond the DC conducting electrode.

A third aspect of the invention provides a semiconductor device comprising: a semiconductor layer; a barrier layer over the semiconductor layer; an insulating layer over the barrier layer; and a composite contact to the semiconductor layer, the composite contact including: a DC conducting electrode attached to the semiconductor layer; and a capacitive electrode, the capacitive electrode partially over the DC conducting electrode and extending beyond the DC conducting electrode.

A fourth aspect of the invention provides a circuit comprising: at least one semiconductor device, the at least one semiconductor device including: a semiconductor layer; a barrier layer over the semiconductor layer; an insulating layer over the barrier layer; and a composite contact to the semiconductor layer, the composite contact including: a DC conducting electrode attached to the semiconductor layer; and a capacitive electrode, the capacitive electrode partially over the DC conducting electrode and extending beyond the DC conducting electrode.

The illustrative aspects of the invention are designed to solve one or more of the problems herein described and/or one or more other problems not discussed.

BRIEF DESCRIPTION OF THE DRAWINGS

These and other features of the invention will be more readily understood from the following detailed description of the various aspects of the invention taken in conjunction with the accompanying drawings that depict various aspects of the invention.

It is noted that the drawings are not to scale. The drawings are intended to depict only typical aspects of the invention, and therefore should not be considered as limiting the scope of the disclosure. In the drawings, like numbering represents like elements between the drawings.

DETAILED DESCRIPTION

As indicated above, aspects of the invention provide a composite contact for a semiconductor device. The composite contact includes a DC conducting electrode that is attached to a semiconductor layer in the device, and a capacitive electrode that is partially over the DC conducting electrode and extends beyond the DC conducting electrode. The composite contact provides a combined resistive-capacitive coupling to the semiconductor layer. As a result, a contact impedance is reduced when the corresponding semiconductor device is operated at high frequencies. As used herein, unless otherwise noted, the term "set" means one or more (i.e., at least one) and the phrase "any solution" means any now known or later developed solution.

Figure 3A:
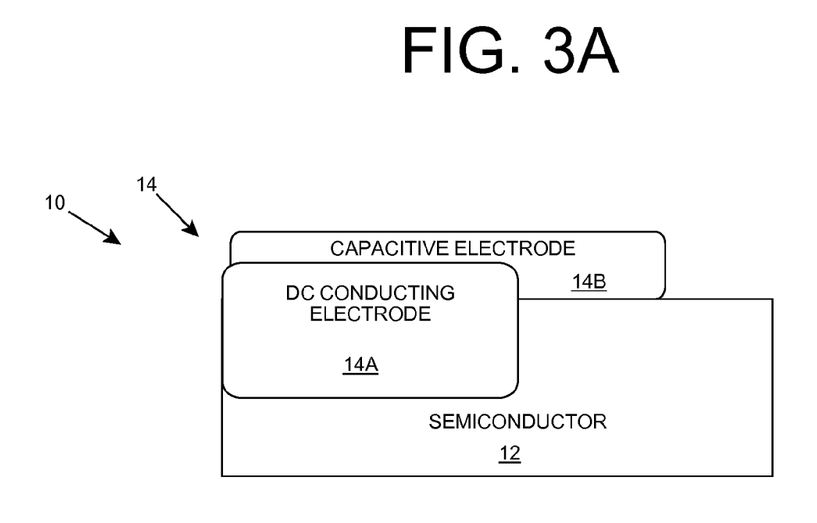
FIGS. 3A-B show an illustrative semiconductor structure and equivalent circuit, respectively, according to an embodiment.
Figure 3B:
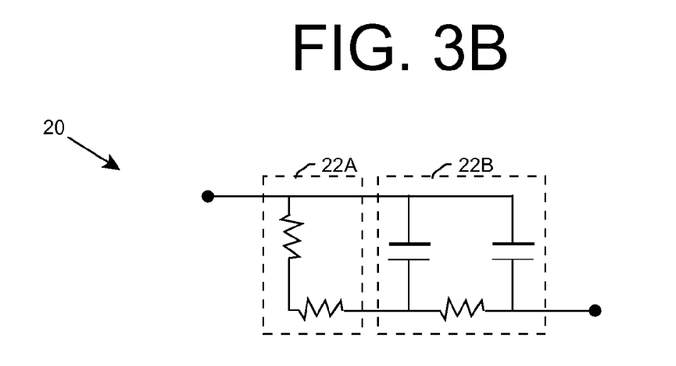

Turning to the drawings, FIGS. 3A-B show an illustrative semiconductor structure 10 and equivalent circuit 20, respectively, according to an embodiment. Structure 10 includes a semiconductor 12, which includes at least one semiconductor layer, and a metal to semiconductor composite contact 14 to a semiconductor layer in semiconductor 12. Contact 14 comprises a composite contact that includes separate conductive and capacitive coupling regions. In particular, contact 14 includes a DC conducting electrode 14A and a capacitive electrode 14B.

DC conducting electrode 14A can be attached to the semiconductor layer. To this extent, DC conducting electrode 14A can comprise an Ohmic or Schottky contact, which is melted into semiconductor 12 above the semiconductor layer, and may or may not be physically contacting the semiconductor layer. Capacitive electrode 14B is formed such that it is partially over DC conducting electrode 14A and extends beyond DC conducting electrode 14A above a surface of semiconductor 12 in a direction that is substantially parallel to the semiconductor layer. To this extent, capacitive electrode 14B includes a first section that is over all or substantially all of DC conducting electrode 14A and a second section that extends beyond the area of DC conducting electrode 14A. In this manner, capacitive electrode 14B forms an additional capacitively coupled contact with the semiconductor layer. Each electrode 14A, 14B can comprise any material, such as for example, titanium, aluminum, nickel, gold, and/or the like. While capacitive electrode 14B is shown only extending beyond DC conducting electrode 14A in a single direction, it is understood that capacitive electrode 14B can extend beyond DC conducting electrode 14A in any number of directions.

As illustrated in equivalent circuit 20, contact 14 provides both resistive and capacitive coupling between contact 14 and the semiconductor layer. In particular, semiconductor 12 can include a barrier layer between capacitive electrode 14B and the semiconductor layer. DC conducting electrode 14A provides resistive coupling 22A to the semiconductor layer, while capacitive electrode 14B provides capacitive coupling 22B to the semiconductor layer with capacitive electrode 14B and the semiconductor layer each serving as a plate of the capacitive contact and the barrier layer separating the two plates. In this manner, contact 14 reduces contact impedance at high frequencies, e.g., contact 14 comprises a radio-frequency enhanced (RFE) contact. The capacitive plate length can vary along a width of contact 14. The semiconductor layer can comprise any type of semiconductor layer, such as a device conducting channel. Further, the device conducting channel can comprise any type of device conducting channel such as a two-dimensional gas (e.g., electron or hole), a doped (n-type or p-type) semiconductor material, an inversion layer (n-type or p-type), and/or the like.

Figure 4:
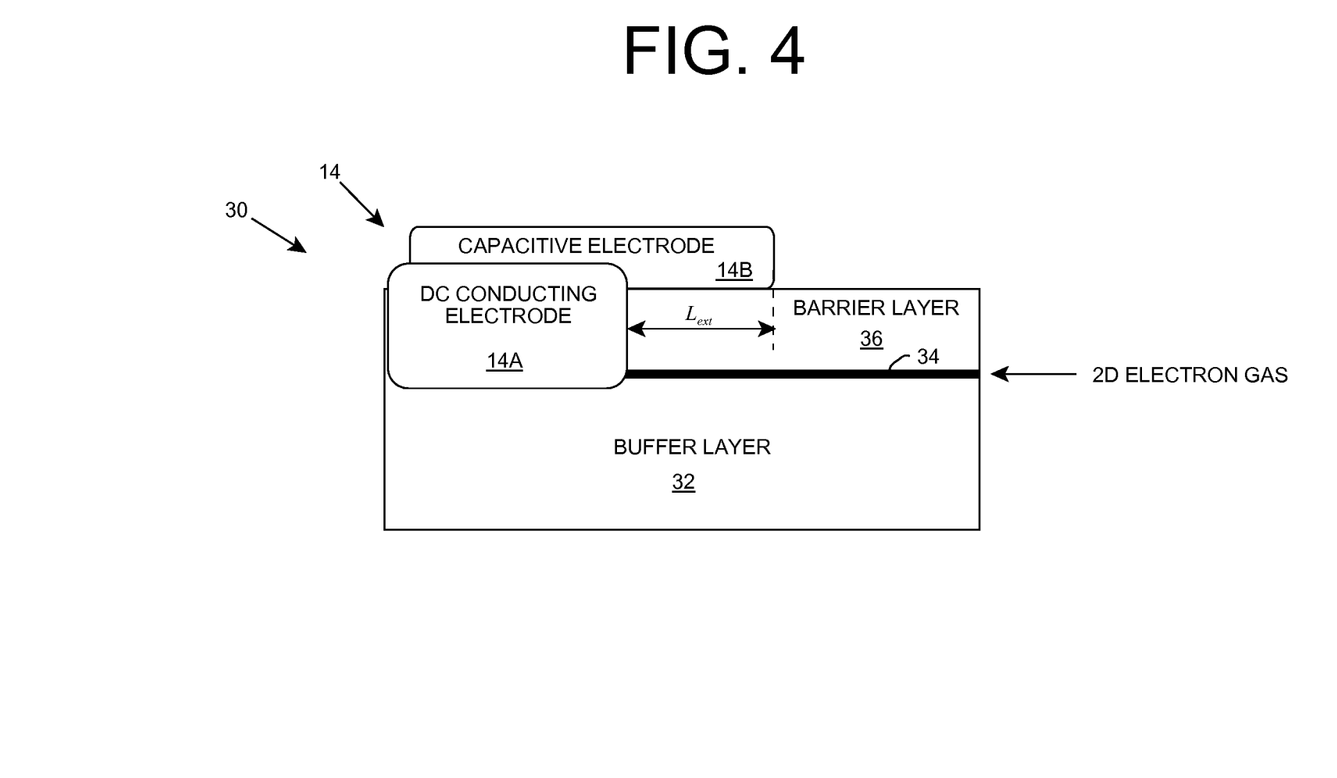
FIG. 4 shows an illustrative semiconductor structure that comprises a heterostructure according to an embodiment.

FIG. 4 shows an illustrative semiconductor structure 30 that comprises a heterostructure according to an embodiment. Structure 30 can comprise, for example, a group III-Nitride based heterostructure such as an aluminum gallium nitride/gallium nitride (AlGaN/GaN) heterostructure. Structure 30 includes a buffer layer 32, a device conducting channel 34 (e.g., a two-dimensional (2D) electron gas), and a barrier layer 36. It is understood that structure 30 could include one or more additional layers, which are not shown for clarity. Contact 14 includes a DC conducting electrode 14A, which is attached to device conducting channel 34, and a capacitive electrode 14B, which extends beyond DC conducting electrode 14A by a length, $L_{ext}$.

Barrier layer 36 separates capacitive electrode 14B from device conducting channel 34. Barrier layer 36 can comprise a semiconductor, dielectric or some combination thereof (e.g., a composite dielectric-semiconductor layer). In an embodiment, barrier layer 36 comprises a semiconductor. For example, barrier layer 36 can comprise a semiconductor having an energy gap that is wider than an energy gap of device conducting channel 34. To this extent, barrier layer 36 can comprise a wide bandgap material (e.g., highly resistive AlGaN) layer. Further, a semiconductor barrier layer 36 can include a depletion region formed by a Schottky contact, such as DC conducting electrode 14A, between capacitive electrode 14B and the semiconductor layer (e.g., device conducting channel 34). Still further, a semiconductor barrier layer 36 can incorporate a p-n junction structure that forms a depletion region.

As discussed herein, structure 30 can be implemented as part of a high frequency semiconductor device. During operation of such a device, in the area of barrier layer 36 over which capacitive electrode 14B extends beyond DC conducting electrode 14A, a radio frequency (RF) signal can inject from capacitive electrode 14B into the active region (e.g., device conducting channel 34) via a strong capacitive coupling that effectively shunts barrier layer 36. In this case, the vertical current component is capacitive and the lateral current component passes through a low-resistive device conducting channel 34 (e.g., 2D electron gas channel), which results in a low overall contact impedance.

Capacitive electrode 14B and device conducting channel 34 form an RC transmission line as illustrated in FIG. 3B. When barrier layer 36 comprises a highly resistive AlGaN layer and device conducting channel 34 comprises a 2D electron gas channel, a propagation constant, γ, and the characteristic impedance, $Z_0$, of the RC transmission line can be calculated by $\gamma = \sqrt{i 2\pi f R_{SH} C_1}$ and $$Z_0 = \frac{1}{W} \sqrt{\frac{R_{SH}}{i 2\pi f C_1}},$$

respectively, where $R_{SH}$ is the sheet resistance of 2D electron gas channel 34, $C_1$ is the metal-channel capacitance per unit area, f is the signal frequency, W is the electrode width, and i is the imaginary unit. In a more general case where barrier layer 36 and/or device conducting channel 34 comprises another type of structure, the expressions for the metal-semiconductor unit-area capacitance, $C_1$, and the layer sheet resistance, $R_{SH}$, must be chosen according to the semiconductor layer structure and the interface properties of capacitive electrode 14B and device conducting channel 34. In any event, an equivalent impedance of contact 14, $Z_{in}$, can be found as an input impedance of the RC transmission line, $$Z_{in} = Z_0 \frac{Z_0 + (R_C/W) \coth(\gamma L_{ext})}{R_C/W + Z_0 \cdot \coth(\gamma L_{ext})},$$

where $R_C$ is the DC contact resistance of DC conducting electrode 14A per unit contact width and $L_{ext}$ is the length of the overhang of capacitive electrode 14B as indicated in FIG. 4.

As illustrated in FIGS. 3A and 4, capacitive electrode 14B can be formed directly on DC conducting electrode 14A and semiconductor 12 (e.g., barrier layer 36). However, it is understood that one or more layers may be included between capacitive electrode 14B and DC conducting electrode 14A and/or semiconductor 12. For example, an insulating barrier (e.g., dielectric) layer can be included under some or all of capacitive electrode 14B. Inclusion of the insulating barrier layer can improve a quality of contact 14, enable additional functionality, and/or the like.

Figure 5:
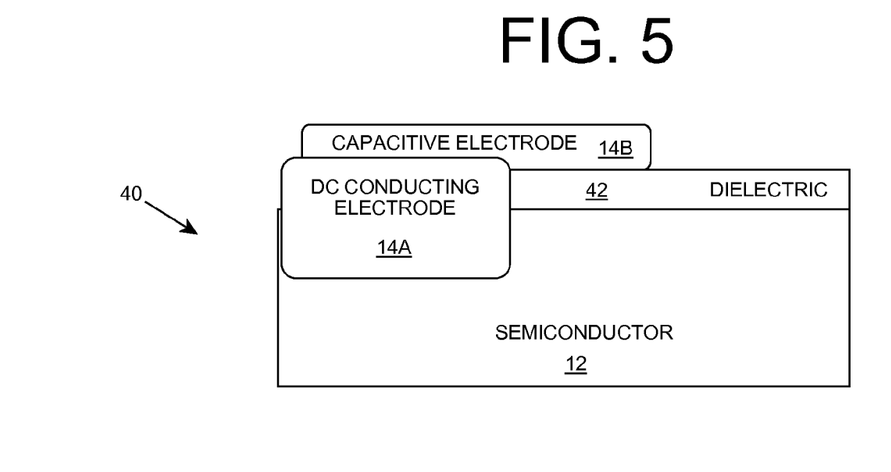
FIG. 5 shows an illustrative semiconductor structure in which a dielectric layer is included between a semiconductor and a capacitive electrode according to an embodiment.

FIG. 5 shows an illustrative semiconductor structure 40 in which a dielectric layer 42 is included between semiconductor 12 and capacitive electrode 14B according to an embodiment. Dielectric layer 42 can be used to adjust an amount of the capacitive coupling provided by capacitive electrode 14B using any solution. For example, a thickness, type of material, and/or the like of dielectric layer 42 can be selected based on semiconductor 12 and the interface properties of capacitive electrode 14B and a device conducting channel in semiconductor 12 using any solution. To this extent, dielectric layer 42 can comprise any type of insulating material, such as for example, silicon dioxide, silicon nitride, aluminum oxide, and/or the like.

Figure 6:
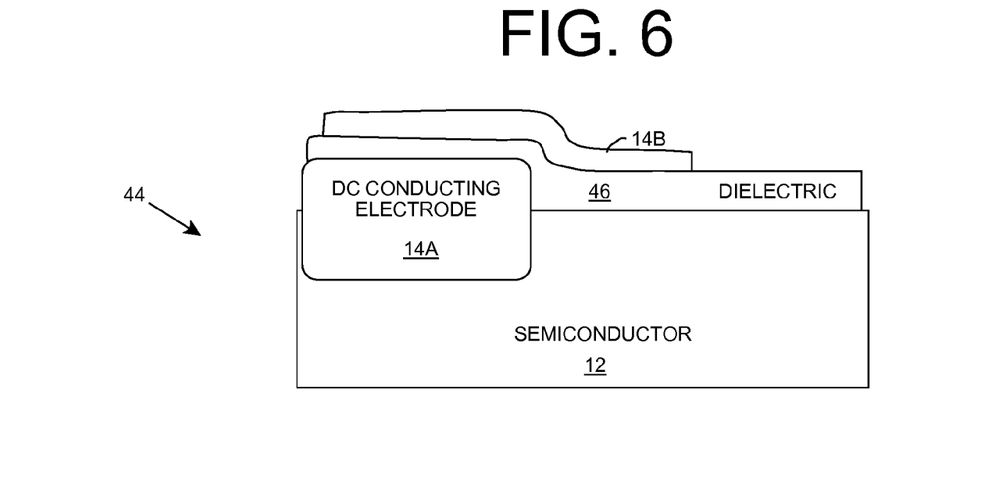
FIG. 6 shows an illustrative semiconductor structure in which a dielectric layer is included under all of a capacitive electrode according to an embodiment.

Further, FIG. 6 shows an illustrative semiconductor structure 44 in which a dielectric layer 46 is included under all of capacitive electrode 14B according to an embodiment. In particular, dielectric layer 46 can be included between both DC conducting electrode 14A and capacitive electrode 14B and between semiconductor 12 and capacitive electrode 14B. Dielectric layer 46 can comprise any type of a thin insulating layer, such as for example, silicon dioxide, silicon nitride, aluminum oxide, and/or the like. Regardless, dielectric layer 46 insulates capacitive electrode 14B from DC conducting electrode 14A and semiconductor 12. In this case, an additional DC or RF voltage can be applied to capacitive electrode 14B to modulate the conductivity of the semiconductor layer (e.g., device conducting channel) in semiconductor 12. For example, by applying a DC voltage to a capacitive electrode 14B that is used as a source and/or drain contact of a field effect transistor, an additional reduction in the access resistance for the field effect transistor can be achieved without requiring more complicated techniques such as selective doping.

Figure 7:
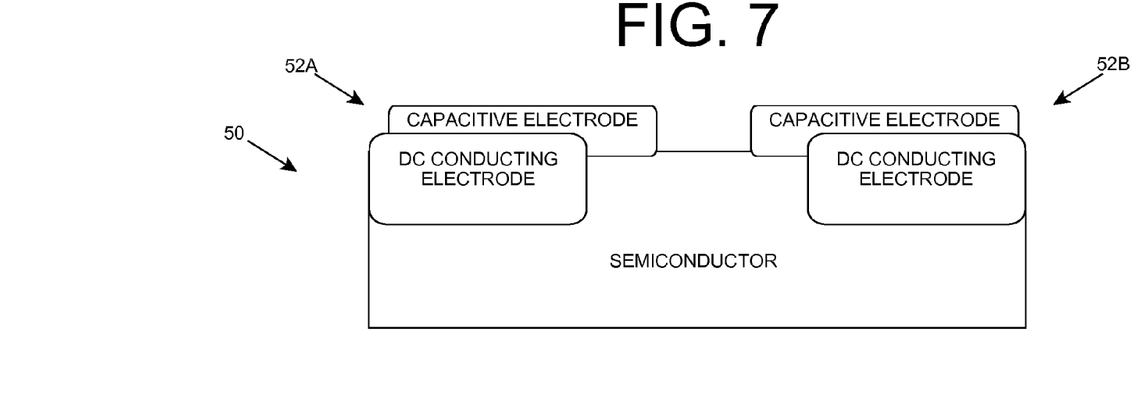
FIG. 7 shows an illustrative diode according to an embodiment.

The illustrative semiconductor structures and contacts 14 described herein can be implemented as part of any type of multi-terminal semiconductor device. For example, a semiconductor device that includes two terminals can include an embodiment of the composite contact described herein as one or both of the terminals. To this extent, FIG. 7 shows an illustrative diode 50 (e.g., a Schottky diode, lateral p-n junction diode, light emitting diode, and/or the like) according to an embodiment. Diode 50 includes two contacts 52A-B, each of which comprises an embodiment of the composite contact described herein. However, it is understood that only one contact for diode 50 may be implemented using a composite contact. The overhanging portions of contacts 52A-B can extend in a direction of the current flow, e.g., toward the other contact 52A-B. In alternative embodiments, the overhanging portions can extend away from the other contact and/or both away from and towards the other contact.

Figure 8:
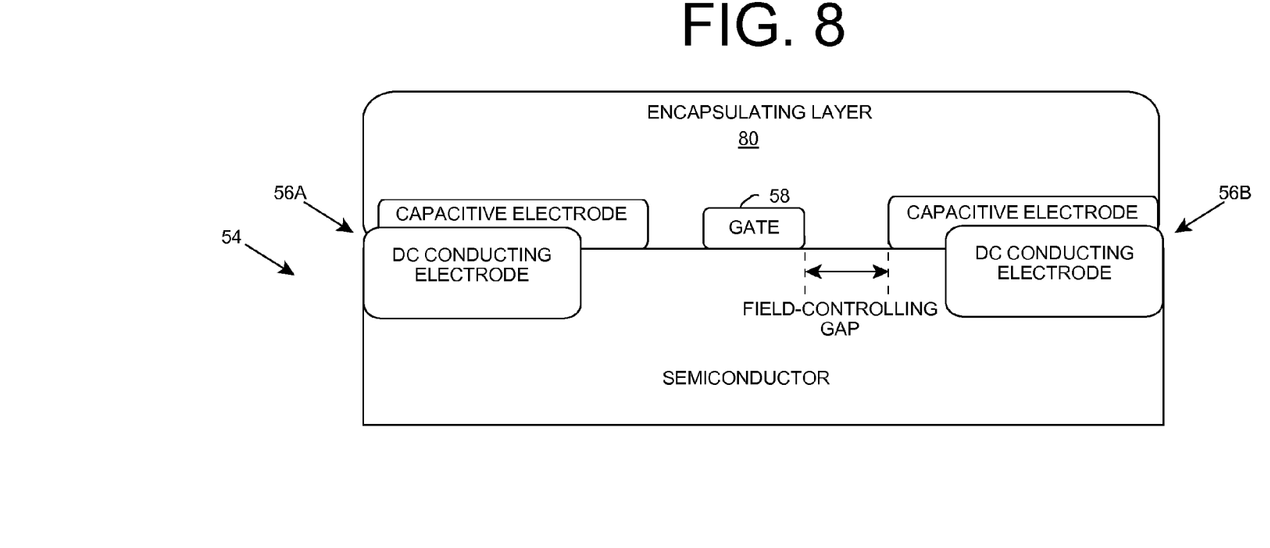
FIG. 8 shows an illustrative field effect transistor according to an embodiment.
Figure 9:
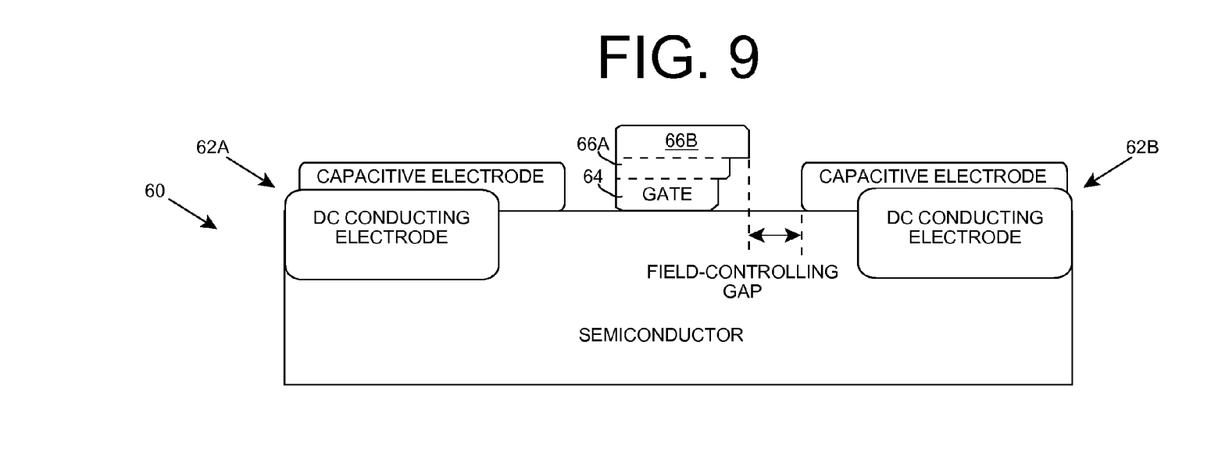
FIG. 9 shows another illustrative field effect transistor according to an embodiment.

Further, a semiconductor device that includes three terminals can include an embodiment of the composite contact described herein as one or more of the terminals. To this extent, FIGS. 8 and 9 show illustrative field effect transistors 54, 60, respectively, according to an embodiment. Each field effect transistor 54, 60 includes a source contact 56A, 62A and a drain contact 56B, 62B, respectively, which are each implemented using an embodiment of the composite contact described herein. However, it is understood that in alternative embodiments only one of source contact 56A, 62A or drain contact 56B, 62B can be implemented using a composite contact. In any event, the overhanging portion of a contact 56A-B, 62A-B can extend in a direction that the current may flow, e.g., toward a gate 58, 64 of the corresponding field effect transistor 54, 60.

When drain contact 56B is implemented using an embodiment of the composite contact described herein, field effect transistor 54 can include a separation distance between the capacitive electrode for drain contact 56B and gate 58 (e.g., field-controlling gap) that ensures a trapezoidal field distribution in a gate-to-drain region of field effect transistor 54. Similarly, field effect transistor 60 includes a set of field plates 66A-B over gate 64. Each field plate 66A-B is shown extending in a direction toward drain contact 62B. In this case, field effect transistor 60 can include a separation distance between the capacitive electrode for drain contact 62B and the field plate closest to drain contact 62B, field plate 66B, (e.g., field-controlling gap) that ensures a trapezoidal field distribution in a spacing between field plates 66A-B and drain contact 62B. In either case, the separation distance can be estimated as a drain-source bias divided by a characteristic field ranging between 0.1 MV/cm and 10 MV/cm. The characteristic field can be determined based on the material properties and device structure of field effect transistor 60 using any solution. By enabling the trapezoidal field distribution in the corresponding spacings, an electron transit time is minimized. It is understood that while two field plates 66A-B are shown for field effect transistor 60, any number of one or more field plates can be included in field effect transistor 60.

Figure 10:
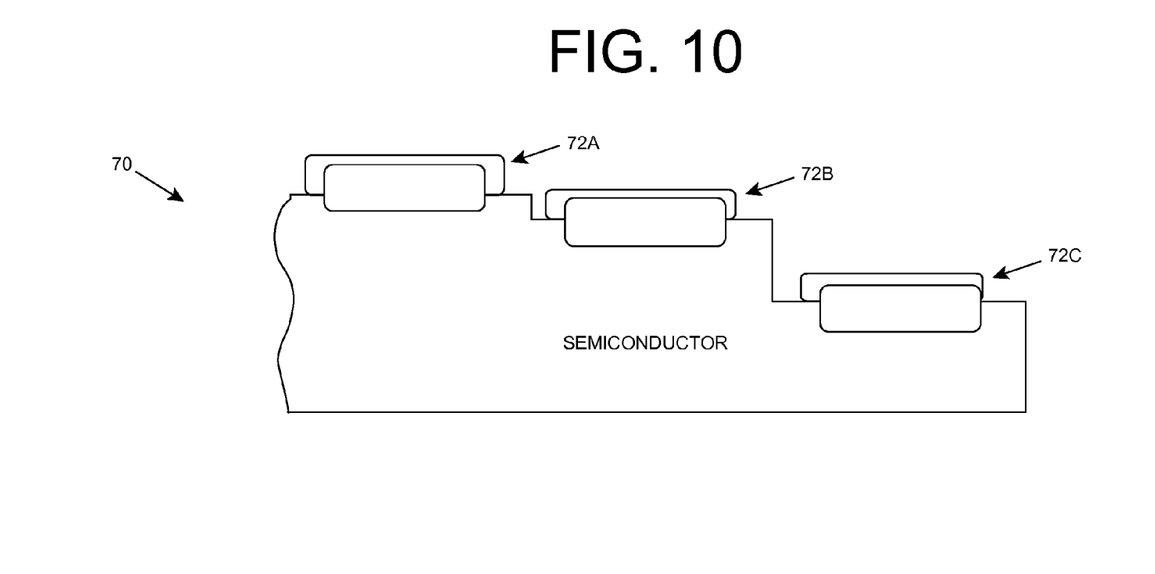
FIG. 10 shows an illustrative bipolar junction transistor according to an embodiment.

Still further, FIG. 10 shows an illustrative bipolar junction transistor 70 according to an embodiment. Bipolar junction transistor 70 is shown including an emitter 72A, a base 72B, and a collector 72C, each of which is implemented using an embodiment of the composite contact described herein. As illustrated, the overhanging portion of collector 72C extends in a direction toward base 72B. However, emitter 72A and base 72B each include overhanging portions on both sides of the DC conducting electrode. Base 72B can include the overhanging portions on both sides of the DC conducting electrode since current can flow in both directions.

It is understood that the devices shown and described in FIGS. 7-10 are only illustrative. For example, while the illustrative composite contacts for the various devices are shown including only a capacitive electrode and a DC conducting electrode, it is understood that any of the composite contacts may include one or more additional layers (e.g., a dielectric layer there between). Further, the structures described herein can be incorporated as part of various additional types of semiconductor devices, including a laser, a photodetector, and/or the like. Additionally, devices made using a structure described herein can be incorporated in various types of circuits and applications, including a radio frequency circuit, a microwave amplifier, an oscillator, a switcher, an optoelectronic circuit, and/or the like.

Still further, it is understood that a device can undergo additional processing, such as the formation of one or more additional layers. For example, operation of a high-power semiconductor device may be limited by premature breakdown, which can be caused by a high voltage jumping through the air or another medium adjacent to the contact regions and the spacing between the contacts (e.g., surface flashover). In this case, the device can include additional layer(s) to prevent or reduce the likelihood of premature breakdown. To this extent, FIG. 8 shows an encapsulating layer 80 on field effect transistor 54. Encapsulating layer 80 can comprise a high dielectric strength insulating material that increases a breakdown voltage of transistor 54, thereby helping to prevent a premature breakdown of transistor 54. The material can have a high breakdown field that well exceeds that of air and is close to that of the material constituting transistor 54. Illustrative examples of materials for encapsulating layer 80 include silicon dioxide, silicon nitride, bisbenzocyclobutene, and/or the like. While encapsulating layer 80 is shown in conjunction with field effect transistor 54, it is understood that encapsulating layer 80 can be included on any type of semiconductor device.

Figure 11:
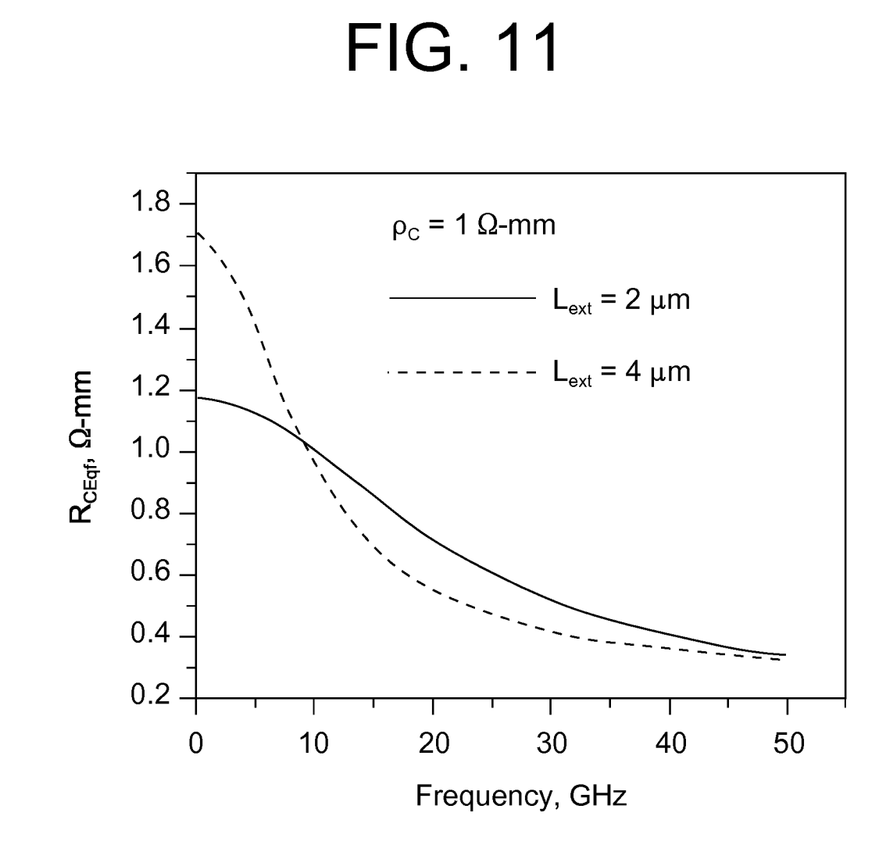
FIG. 11 shows a simulated frequency dependence of a composite contact formed on an AlGaN/GaN heterostructure according to an embodiment.

The composite contact described herein provides a combined resistive-capacitive coupling to a semiconductor layer. As a result, a contact impedance is reduced when a corresponding high frequency semiconductor device is operated at high frequencies. To this extent, FIG. 11 shows a simulated frequency dependence of a composite contact formed on an AlGaN/GaN heterostructure according to an embodiment. Two simulations are illustrated with varying lengths that the capacitive electrode overhangs the DC conducting electrode, i.e., $L_{ext}$=2 and 4 μm. For the simulations, a contact resistance of the ohmic part, ρc, of 1 Ω-mm and a two degree electron gas sheet resistance of 300Ω were used. Additionally, a barrier layer thickness was approximately 200 Angstroms with a dielectric permittivity ∈≈9. As illustrated, much lower contact impedances can be achieved at microwave frequencies as compared to the DC due to the additional capacitive coupling of the composite contact.

Figure 12:
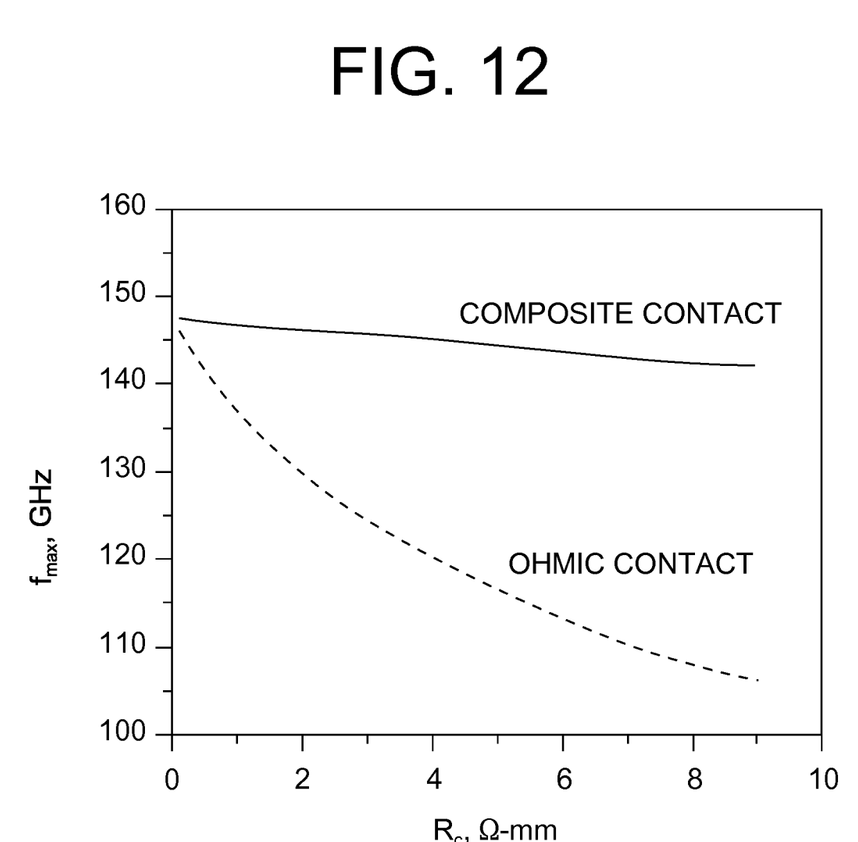
FIG. 12 shows a simulated maximum oscillation frequency for a composite contact and a regular ohmic contact, each of which was formed on an AlGaN/GaN heterostructure field effect transistor according to an embodiment.

FIG. 12 shows a simulated maximum oscillation frequency for a composite contact and a regular ohmic contact, each of which was formed on an AlGaN/GaN heterostructure field effect transistor according to an embodiment. In this case, the capacitive electrode of the composite contact extended beyond the DC conducting electrode by 0.2 μm ($L_{ext}$), while the other parameters used in the simulations were the same as described above with respect to FIG. 11. The simulated maximum oscillation frequencies for the respective contacts are shown as a function of DC contact resistance. As illustrated, a significant performance improvement can be obtained for a microwave device with the composite contact as compared to a microwave device with a regular ohmic contact. In particular, the additional capacitive coupling can make the maximum oscillation frequency, $f_{MAX}$, largely insensitive to the DC contact resistance, $R_C$, while the ohmic contact has significant degradation of the maximum oscillation frequency due to the DC contact resistance.

The composite contact and corresponding structures and devices can be manufactured using any solution. In an embodiment, a solution as shown and described in the co-pending U.S. Utility application Ser. No. 11/781,308, titled "Fabrication of semiconductor device having composite contact", which was filed on 23 Jul. 2007, and which was previously incorporated by reference, is used to manufacture the composite contact and corresponding structures and devices. Regardless, a composite contact can be formed by depositing and annealing a metal (e.g., Ohmic) contact to a semiconductor layer. During formation of the metal contact, a high annealing temperature may not be required since achieving a low DC contact resistance may not be essential. Alternatively, the metal contact may be formed without annealing, thereby forming a Schottky contact. Subsequently, a capacitive electrode having a portion over the DC conducting electrode and a portion extending beyond the DC conducting electrode can be formed (e.g., deposited). Formation of the capacitive electrode can be combined with additional processing, such as the formation of a gate or another electrode for the structure/device, thereby allowing for an alignment-free formation process and/or tight spacing.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A semiconductor structure comprising:
   a semiconductor layer;
   a gate; and
   a composite contact to the semiconductor layer, the composite contact including:
   a first electrode attached to the semiconductor layer;
   an insulating layer at least partially over the first electrode; and
   a second electrode over the insulating layer and capacitively coupled to the semiconductor layer, the second electrode partially over and not contacting the first electrode and including a portion extending beyond the first electrode towards a location for the gate next to the composite contact, wherein the portion is substantially parallel to the semiconductor layer and extends only a portion of a distance between the composite contact and the location for the gate.

2. The structure of claim 1, further comprising a barrier layer over the semiconductor layer, the barrier layer separating the second electrode from the semiconductor layer.

3. The structure of claim 2, the barrier layer comprising at least one of: a dielectric or a semiconductor.

4. The structure of claim 2, the barrier layer comprising a semiconductor having an energy gap that is wider than an energy gap of a device conducting channel.

5. The structure of claim 1, further comprising an encapsulating layer over the composite contact, the encapsulating layer comprising a dielectric material having a high breakdown field.

6. The structure of claim 1, further comprising a device conducting channel.

7. The structure of claim 6, the device conducting channel comprising one of:
   a two-dimensional gas, a doped semiconductor material, or an inversion layer.

8. The structure of claim 1, wherein the insulating layer extends beyond the first electrode towards the location for the gate.

9. The structure of claim 1, wherein the semiconductor structure comprises a group III-Nitride based heterostructure.

10. A field effect transistor comprising:
    a semiconductor layer;
    a composite contact to the semiconductor layer, the composite contact including:
    a first electrode attached to the semiconductor layer; and
    a second electrode capacitively coupled to the semiconductor layer, the second electrode partially over the first electrode and including a portion extending beyond the first electrode, wherein the portion is substantially parallel to the semiconductor layer; and
    a gate, wherein the portion extends beyond the first electrode towards the gate.

11. The transistor of claim 10, the composite contact comprising a drain contact and being separated from the gate by a distance that ensures a trapezoidal field distribution in a gate-to-drain region of the device.

12. The transistor of claim 10, further comprising at least one field plate over the gate, the composite contact comprising a drain contact and being separated from the at least one field plate by a distance that ensures a trapezoidal field distribution in a region between the at least one field plate and the drain contact of the device.

13. The transistor of claim 10, the composite contact comprising a drain contact, the transistor further comprising a source contact.

14. A semiconductor device comprising:
    a semiconductor layer;
    a barrier layer over the semiconductor layer;
    an insulating layer over the barrier layer;
    a composite contact to the semiconductor layer, the composite contact including:
    a first electrode attached to the semiconductor layer, wherein the insulating layer is at least partially over the first electrode; and
    a second electrode over the insulating layer and capacitively coupled to the semiconductor layer, the second electrode partially over and not contacting the first electrode and including a portion extending beyond the first electrode towards a location for a second contact next to the composite contact, wherein the portion is substantially parallel to the semiconductor layer and extends only a portion of a distance between the composite contact and the location for the second contact; and
    the second contact over the barrier layer, the composite contact comprising a drain contact and the second contact comprising a gate for a field effect transistor, the drain contact being separated from the gate by a distance that ensures a trapezoidal field distribution in a gate-to-drain region of the device.

15. The device of claim 14, further comprising an encapsulating layer over the composite contact, the encapsulating layer comprising a dielectric material having a high breakdown field.

16. A semiconductor structure comprising:
    a semiconductor layer;
    a composite contact to the semiconductor layer, the composite contact including:
    a first electrode attached to the semiconductor layer;
    an insulating layer at least partially over the first electrode; and
    a second electrode over the insulating layer and capacitively coupled to the semiconductor layer, the second electrode partially over and not contacting the first electrode and including a portion extending beyond the first electrode towards a location for a second contact next to the composite contact, wherein the portion is substantially parallel to the semiconductor layer and extends only a portion of a distance between the composite contact and the location for the second contact; and
    the second contact, wherein the second contact includes:
    a third electrode attached to the semiconductor layer; and
    a fourth electrode partially over the third electrode and extending beyond the third electrode towards a location for the composite contact, wherein the fourth electrode extends only a portion of the distance between the composite contact and the second contact.

17. The structure of claim 16, wherein the composite contact comprises one of a collector or an emitter, and wherein the second contact comprises a base, the structure further comprising the other of the collector or the emitter.

* * * * *